(12) United States Patent
Wang et al.

(10) Patent No.: US 8,633,090 B2
(45) Date of Patent: Jan. 21, 2014

(54) METHOD FOR FORMING SUBSTRATE WITH BURIED INSULATING LAYER

(75) Inventors: Xiang Wang, Shangha (CN); Xing Wei, Shangha (CN); Miao Zhang, Shangha (CN); Chenglu Lin, Shangha (CN); Xi Wang, Shanghai (CN)

(73) Assignees: Shanghai Simgui Technology Co., Ltd., Shanghai (CN); Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 47 days.

(21) Appl. No.: 13/383,416

(22) PCT Filed: Jul. 10, 2010

(86) PCT No.: PCT/CN2010/075098
§ 371 (c)(1),
(2), (4) Date: Jan. 10, 2012

(87) PCT Pub. No.: WO2011/003366
PCT Pub. Date: Jan. 13, 2011

(65) Prior Publication Data
US 2012/0122299 A1    May 17, 2012

(30) Foreign Application Priority Data

Jul. 10, 2009  (CN) ............................ 200910054626
Jul. 10, 2009  (CN) ............................ 200910054627
Nov. 27, 2009  (CN) ............................ 200910199624

(51) Int. Cl.
*H01L 21/762* (2006.01)
(52) U.S. Cl.
USPC .... 438/458; 257/627; 257/506; 257/E21.485; 257/E27.112; 257/E21.568

(58) Field of Classification Search
USPC .................. 438/406, 455, 458, 459, 689, 690
See application file for complete search history.

(56) References Cited

U.S. PATENT DOCUMENTS

| | | | |
|---|---|---|---|
| 5,937,312 A * | 8/1999 | Iyer et al. ....................... | 438/459 |
| 2006/0115986 A1 * | 6/2006 | Donohoe et al. .............. | 438/690 |
| 2007/0148912 A1 | 6/2007 | Morita et al. | |
| 2008/0315349 A1 * | 12/2008 | Takei et al. ................... | 257/506 |
| 2009/0095399 A1 | 4/2009 | Zussy et al. | |

FOREIGN PATENT DOCUMENTS

| | | |
|---|---|---|
| CN | 101084577 A | 5/2007 |
| CN | 101599451 A | 12/2009 |
| CN | 101599452 A | 12/2009 |
| JP | 7335846 A | 12/1995 |
| JP | 2006270039 A | 10/2006 |
| WO | WO 2006092886 A1 * | 9/2006 |

* cited by examiner

*Primary Examiner* — Chuong A Luu
*Assistant Examiner* — Rodolfo Fortich (57) ABSTRACT

A method for forming an edge-chamfered substrate with a buried insulating layer is provided, which comprises the following steps: providing a first substrate (S10); forming an etching mask layer on surfaces of the first substrate, wherein said etching mask layer is formed on the whole surfaces of the first substrate (S11); chamfering a glazed surface of the first substrate and the etching mask layer thereon by the edge grinding (S12); by rotary etching, etching the first substrate which is exposed by the edge grinding on the etching mask layer (S13); providing a second substrate (S14); and bonding the first substrate to the second substrate with a buried insulating layer (S15). The method avoids the edge collapses and the changes of the warp degree in subsequent processes.

23 Claims, 8 Drawing Sheets

METHOD FOR FORMING SUBSTRATE WITH BURIED INSULATING LAYER

FIELD OF THE INVENTION

The present invention relates to the field of semiconductor material, and especially relates to a method for forming an edge-chamfered substrate with a buried insulating layer.

BACKGROUND OF THE INVENTION

A silicon on insulator (SOI) is primarily structured by a top silicon on an upper layer, a silicon dioxide on an intermediate hidden buried layer and a handle substrate on a bottom. To form the above-mentioned three-layer structures, a method of bonding SOI is provided by directly bonding to harden two pieces of silicon wafer in a high temperature. The top silicon (or as called "device layer") is thinned to a certain thickness by a series of processes. However, due to the variation of edge shape of the original silicon wafer after thinning, the silicon wafer must proceed in a specific edge process. The edge of top silicon needs to be removed by edge grinding or polishing, and otherwise comes into edge collapses in subsequent process.

In the relevant prior art, there are two methods of forming edge chamfer on the SOI substrate.

The first method is that, after a chamfer grinding is performed on the SOI substrate, the SOI wafer is immerged into the tetramethylammonium hydroxide (TMAH) to etch off the excess silicon on the edge. Afterward, the SOI wafer is immerged into a hydrofluoric acid which cannot etch off silicon and thus the solution of hydrofluoric acid etch off silicon dioxide residual on the edge.

The above mentioned process of removing the silicon dioxide residual on the edge must have the hydrofluoric acid immergence. However, this would destroy a thermal-oxidation silicon dioxide cover layer on a handle substrate surface of the SOI substrate and therefore destroy a balance warp degree of the silicon wafer. In addition, it would lead to many undesired defects after TMAN immergence.

The other method is that, there is not chamfer grinding performed on the SOI substrate with thin top silicon after grinding the top silicon but direct removal of edge residual silicon dioxide by oxide polishing solution of chemically mechanical polishing.

Since processing steps of the aforementioned two processing methods are complex, the shape of edge chamfered is not easy to control. It is very hard to control the amount of removing edge to ensure the concentricity of the substrate. This methods readily result in remaining of silicon oxide on the edge so that the silicon wafer can not proceed in single face processes and the whole warp degree of substrate is destroyed to impact applications of the subsequent processes.

SUMMARY OF THE INVENTION

A technical problem of the present invention to solve is, providing a method for forming a substrate with a buried insulating layer, which can accomplish treatment process of the edge of the substrate without etching of the original cover layer of the back, and can avoid remaining redundant buried insulating layer on the edge and thus ensure that the warp degree of the substrate is not affected.

To resolve the above problems, the present invention provides a method for forming an edge-chamfered substrate with a buried insulating layer, which comprises the following steps: providing a first substrate for forming a top semiconductor layer of the substrate with a buried insulating layer; forming an etching mask layer on the surface of the first substrate; chamfering the first substrate and the etching mask layer on the surface of the first substrate by edge grinding; by spin etching, etching the first substrate which is exposed by edge grinding on the etching mask layer; providing a second substrate for forming a handle layer of the substrate with a buried insulating layer; and bonding the first substrate to the second substrate with buried insulating layer, wherein the surface of the first substrate with edge grinded faces the second substrate.

The present invention also provides a method for forming an edge-chamfered substrate with a buried insulating layer, wherein the method comprises the following steps: providing a first substrate; forming sequentially an etching mask layer and a top semiconductor layer on surfaces of the first substrate; placing downwardly the top semiconductor layer of the first substrate on a spin etching carrier platform, and passing an etching solution etching the top semiconductor layer to the back side of the first substrate along with rotating the substrate, and passing the etching solution through the edge of the first substrate to the edge of the top semiconductor layer in order to etch the edge part of the top semiconductor layer; providing a second substrate for forming a handle substrate with a buried insulating layer; bonding the first substrate to the second substrate with the buried insulating layer wherein the top semiconductor layer of the first substrate with edge etched faces the second substrate; and removing the first substrate and the etching mask layer.

The present invention also provides a method for forming an edge-chamfered substrate with a buried insulating layer, which comprises the following steps: providing a semiconductor substrate with a buried insulating layer wherein the semiconductor substrate comprises a handle layer, a buried insulating layer and a top semiconductor layer; forming cover layers both on the upper and lower surfaces of the substrate wherein the upper surface is a lateral surface of the top semiconductor layer and opposed to the lower surface; chamfering edges of the buried insulating layer and the top semiconductor layer by edge grinding; placing upwardly the upper surface of the substrate on a spin etching carrier platform, and passing sequentially an etching solution for the cover layer and the buried insulating layer to the cover layer of the upper surface of the substrate along with rotating the substrate and thereby removing the cover layer of the upper surface and the buried insulating layer on the edge of substrate which is exposed by grinding the cover layer, but preserving the back cover layer.

The present invention also provides a method for forming an edge-chamfered substrate with a buried insulating layer, which comprises the following steps: providing a semiconductor substrate with a buried insulating layer wherein the substrate comprising a handle layer, a buried insulating layer and a top semiconductor layer; forming cover layers both on the front and back of the semiconductor substrate wherein the front is a lateral surface of the top semiconductor layer and opposed to the back; removing the front cover layer of the substrate by grinding; placing downwardly the front of the substrate on a spin etching carrier platform, and passing an etching solution of the top semiconductor layer to the back cover layer of the substrate along with rotating the substrate, and passing the etching solution through the edge of the substrate to the front, and etching the edge part of the front of the top semiconductor layer; placing upwardly the front of the substrate on the spin etching carrier platform, and passing the etching solution of the buried insulating layer to the front of the substrate along with rotating the substrate, and by etching, removing the edge of the substrate in which the top semiconductor layer is etched to expose by the buried insulating layer.

The advantages of the present invention are, electively performing a spin etching process before or after bonding so as to remove the edge of the top silicon layer by etching and thereby avoiding occurrence of the manner that the edge collapses in subsequent processes; according to the condition of the surface of the substrate, choosing flexibly a way of processing spin etching, which can apply edge etching effectively on the objective layer without an injury of the preserved parts needed.

DETAILED DESCRIPTION OF THE INVENTION

The followings are the detailed description of the present invention which provides a method for forming an edge-chamfered substrate with a buried insulating layer, accompanying with the figures.

At first, the first embodiment of the present invention is provided with the figures.

Figure 1:
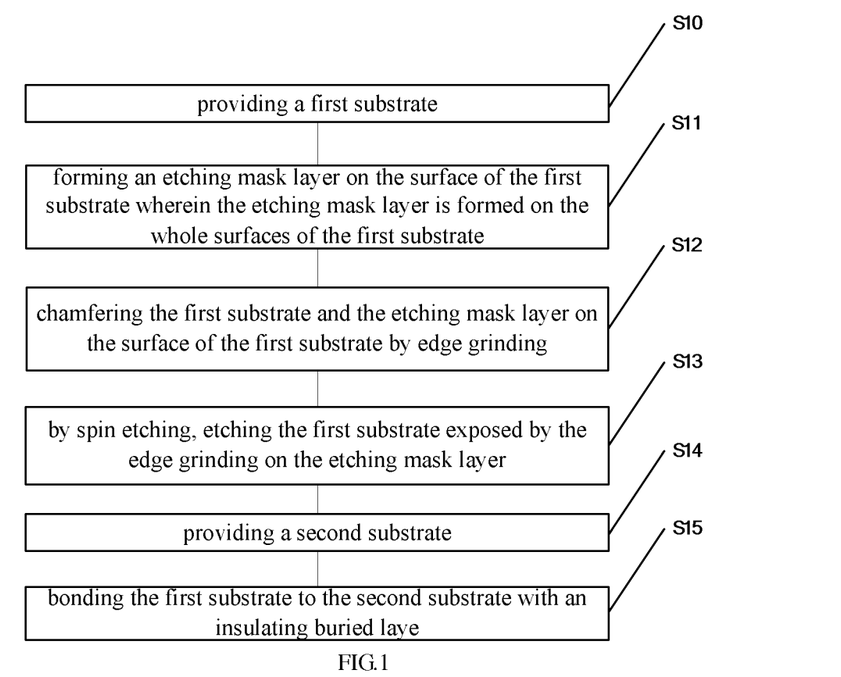
FIG. 1 is a schematic diagram illustrating implementing steps of the first embodiment of the present invention.

FIG. 1 is a schematic diagram illustrating implementing steps of this embodiment. The method comprises the following steps: step S10, providing a first substrate; step S11, forming an etching mask layer on the surface of the first substrate wherein the etching mask layer is formed on the whole surfaces of the first substrate; step S12, chamfering the first substrate and the etching mask layer on the surface of the first substrate by edge grinding; step S13, by spin etching, etching the first substrate exposed by the edge grinding on the etching mask layer; step S14, providing a second substrate; and step S15, bonding the first substrate to the second substrate with an insulating buried layer.

FIGS. 2-8 are schematic diagrams illustrating process of the first embodiment.

Figures 2, 3:
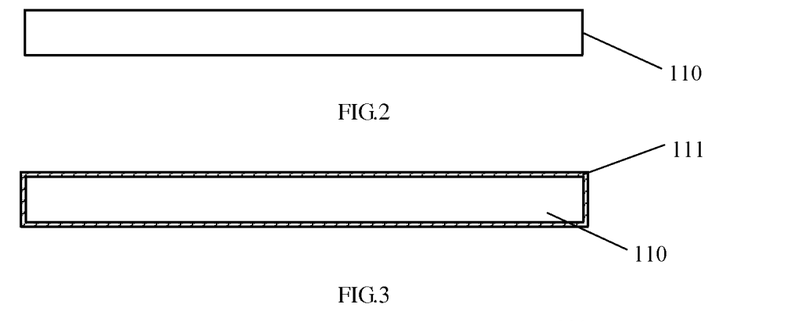
FIGS. 2-8 are schematic diagrams illustrating process of the first embodiment of the present invention.

As shown in FIG. 2, with reference to the step S10, a first substrate 110 is provided. The first substrate 110 of this embodiment is monocrystalline silicon substrate. The first substrate 110 is used to form a top semiconductor layer of the substrate with a buried insulating layer. Thus, it needs to choose the material of the first substrate 110 according to the requirements of the objective product in the other embodiments, such as anyone of the silicon carbide, the silicon germanium, the strained silicon and various compound semiconductors.

As shown in FIG. 3, with reference to the step S11, the surface of the first substrate 110 forms etching mask layers 111 wherein the etching stop layers 111 are formed on the whole surfaces of the first substrate 110. In this embodiment, the material of the etching mask layer 111 is silicon oxide and the etching mask layers 111 are formed by thermal oxidation.

The advantages of forming the etching mask layers 111 both on the front and back of the first substrate 110 is a capability of protecting the back of the first substrate 110 from being etched by etching solution in subsequent process. It will affect the wrap characteristics of the whole substrate that the back of the first substrate is etched, and bring uncertainty to the bonding process.

In another embodiment, it should choose suitable material of the etching mask layers 111 according to the properties of the material of the first substrate 110 and the etching solution in the subsequent process of selectively etching. How to choose the material of the etching mask layer for the process of selectively etching is a common knowledge in the art. There will not be enumerated for that.

Figure 4:
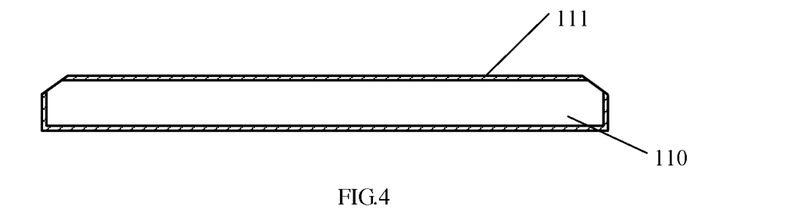

As shown in FIG. 4, with reference to the step S12, a glazed surface of the first substrate 110 and the etching mask layer 111 thereon are chamfered by edge grinding.

Figure 5:
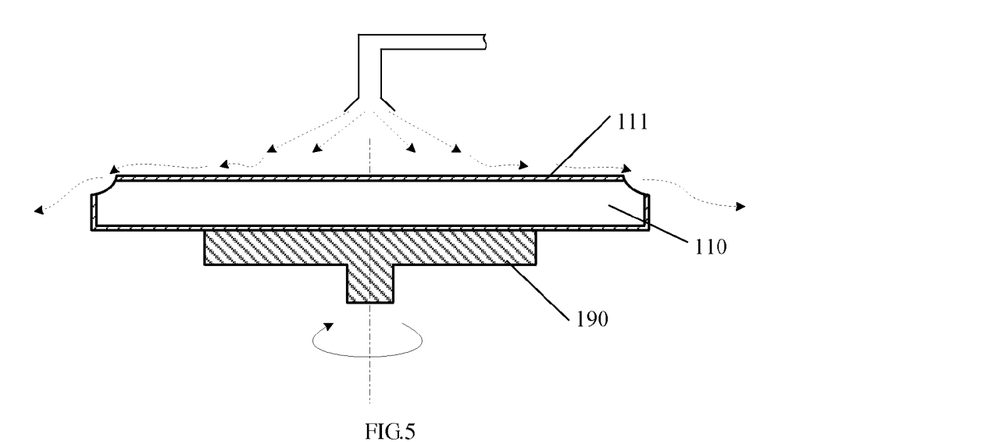

An edge grinding process for chamfering the wafer is a common process, which will not be discussed later. The chamfering processing step grinds the edge of the etching mask layer 111 and the first substrate 110 both to inclined surfaces exposing the edge part of the first substrate 110 by calculating the angle and speed of grinding. It makes sure that the etching process in subsequent will be carried out, smoothly As shown in FIG. 5, with reference to the step S13, the first substrate 110 exposed by the edge grinding on the etching mask layer is etched by rotary etching. In this embodiment, the chamfered surface of the first substrate 110 is upwardly deposited on the spin etching carrier platform 190 and the etching solution is passed through the upward surface along with rotating the first substrate 110.

According to this embodiment, since silicon oxide is used to be the etching mask layer 111, the etching mask layer 111 can suffer a lone-time etching in the etching solution, whereby the chamfered surface of the first substrate 110 can be upwardly deposited on the spin etching carrier platform and the etching solution is passed through the upward surface, namely the surface of the etching mask layer 111, along with rotating the substrate.

To ensure the quality of the spin etching, it needs to optimize the rotary rate of the spin etching. If a high efficient etching on the edge of the first semiconductor 110 is required in the step, it should control flow of the etching solution not to the other surface of the first substrate 110 as far as possible. Thus, it is great to be able to control the rotary rate of the platform 190 in a greatly large range upon the spin etching. In experiments, an optimal rotary rate is more than 500 cycles per minute in this step, especially in being more than 1500 cycles per minute.

As the above-mentioned step, in this embodiment the first substrate 110 is single crystal silicon substrate and the material of the etching mask layer is silicon oxide. Therefore, the tetramethylammonium hydroxide can be used to be the etching solution for spin etching in this step. Certainly, other etching solutions, such as potassium hydroxide, catechol-ethylenediamine-water and the likes, which are commonly known in the art can also be used in this step.

The etching time and the concentration of the etching solution are also process parameters which need to be optimized. Thus it makes the etching rate controllable and the etching time controlled within the reasonable range. If passing flow of the etching solution is too large or the concentration of the etching solution is too high, then the etching rate becomes fast and hard to control. On the contrary, if passing flow of the etching solution is too small or the concentration of the etching solution is too low, then the etching time becomes long that is not to benefit for the process efficiency. Thus, it needs to control the concentration and flow of the etching solution within the reasonable range, in order to get etching controllability and balance of the speed. In experiments, the mass concentration range of the etching solution are 5% to 49%, and the flow range of the etching solution are 500 ml to 2500 ml per minute which are optimal process parameters.

Figure 6:
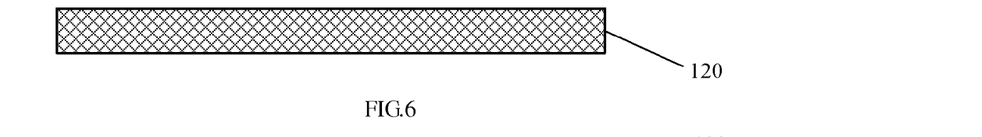

As shown in FIG. 6, with reference to the step S14, a second substrate 120 is provided. The second substrate 120 is used to form a handle layer of the substrate with a buried insulating layer.

The materials selected for the second substrate 120 are broader. Due to the second substrate 120 used as handle layer, in addition to commonly-known substrates such as common monocrystalline silicon substrate and sapphire substrate, silicon carbide, diamond, glass, even metal substrate and on the likes are also the available choices.

Figure 7:
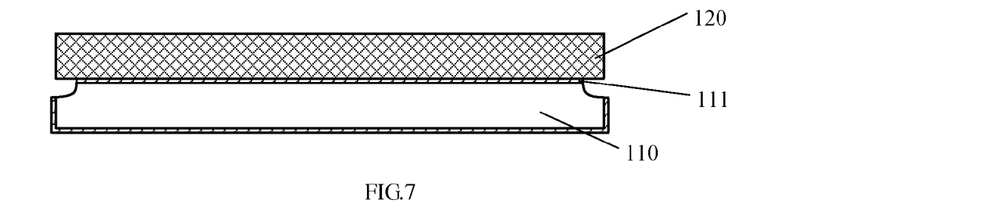

As shown in FIG. 7, with reference to the step S15, the first substrate 110 is bonded to the second substrate 120 with the buried insulating layer, wherein the surface of the first substrate 110 with edge grinded faces the second substrate 120. The buried insulating layer is used as the etching mask layer 111 for etching mask in the above step in this embodiment.

In the other embodiments, if the etching mask layer 111 is not insulated, the etching mask layer tends to be damaged in the etching process, or other reasons leading it not to fit for the buried insulating layer of the final product, then the etching mask layer 111 can also be removed and a new buried insulating layer grows, additionally. The new buried insulating layer can grow on the surface of the first substrate 110, and can also grow on the surface of the second substrate 120, and of course can also grow on both surfaces of the two substrates.

The bonding process is a commonly-known process in the art and therefore is not detailed in concrete embodiment.

Further, it is able to thin the first substrate 110 to an objective thickness according to the requirements after the step S15 is implemented. The thinning may use a variety of the common processes including etching, grinding and stripping, which will not be discussed here.

Figure 8:
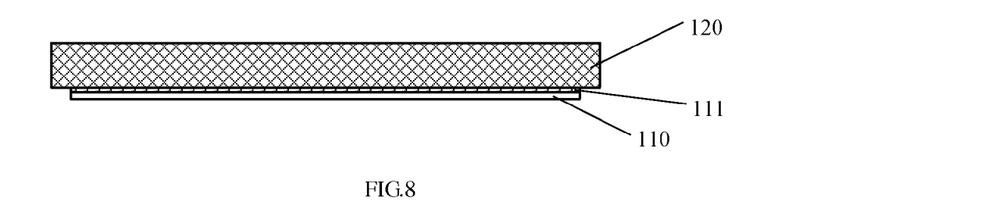

As shown in FIG. 8, the substrate with a buried insulating layer 111 was thinned, which includes the second substrate 120 used as handle substrate and the first substrate 110 used as top semiconductor layer. Since the first substrate 110 is made by chamfer process before its surface is bonded, the edge of the top semiconductor layer of the thinned substrate has been removed previously before bonding and does not need to process again. Compared with the prior art, this embodiment firstly performs the process of the edge etching and then bonding. This would avoid damaging the bonded substrate during the process of processing edge of the bonded substrate. The first substrate is etched to form the top semiconductor by spin etching process in which the etching rate is easy to control and the uniformity and concentricity is better than the common etching processes, especially in fitting for edge etching of the wafer.

The following is the second embodiment of the present invention provided with the figures.

Figure 9:
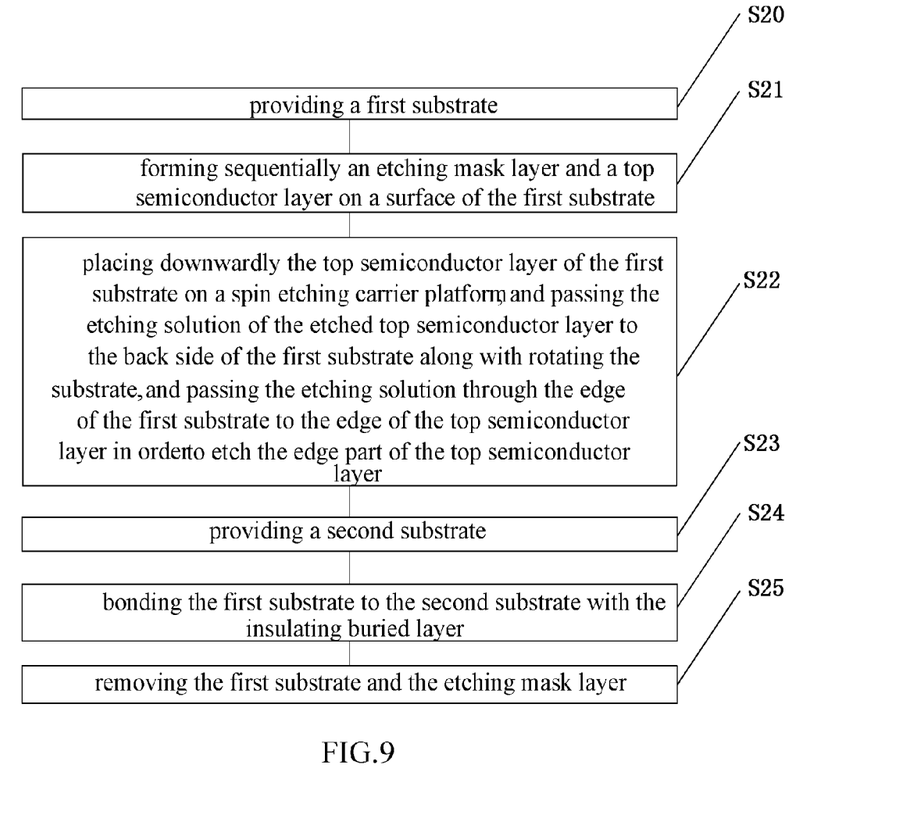
FIG. 9 is a schematic diagram illustrating implementing steps of the second embodiment of the present invention.

FIG. 9 is a schematic diagram illustrating implementing steps of this embodiment, which comprises the following steps: step S20, providing a first substrate; step S21, forming sequentially an etching mask layer and a top semiconductor layer on a surface of the first substrate; step S22, placing downwardly the top semiconductor layer of the first substrate on a spin etching carrier platform, and passing the etching solution of the etched top semiconductor layer to the back side of the first substrate along with rotating the substrate, and passing the etching solution through the edge of the first substrate to the edge of the top semiconductor layer in order to etch the edge part of the top semiconductor layer; step S23, providing a second substrate for forming a handle substrate with a buried insulating layer; step S24, bonding the first substrate to the second substrate with the buried insulating layer, wherein the top semiconductor layer of the first substrate with edge grinded faces the second substrate; and step S25, removing the first substrate and the etching mask layer.

The material of the top semiconductor layer is silicon, and the corresponding etching solution for the top semiconductor layer is tetramethylammonium hydroxide. The material of the buried insulating layer is silicon oxide. The material of the top semiconductor can be germanium, silicon germanium and anyone of the common semiconductor materials in the other embodiments. The material of the buried insulating layer can be silicon nitride and other insulating materials. And the suitable etching solution is selectively used to etch the top semiconductor layer according to the materials used.

FIGS. 10-15 are schematic diagrams illustrating process of this embodiment.

Figure 10:
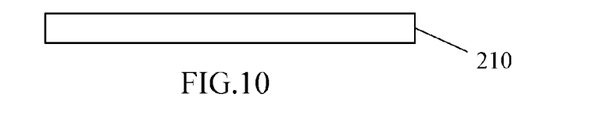
FIGS. 10-14 are schematic diagrams illustrating process of the second embodiment of the present invention.

As shown in FIG. 10, with reference to the step S20, a first substrate 210 is provided.

The first substrate 210 of this embodiment is monocrystalline silicon substrate. The first substrate 110 is used as a handle substrate for the top semiconductor layer. Thus, a range of choosing the material is very widely. The material of the first substrate 210 may be, such as anyone of the silicon carbide, the silicon germanium, the strained silicon and various compound semiconductors in the other embodiments. The material of the first substrate 210 can even be aluminium or copper, and other metal materials, in addition to monocrystalline silicon, sapphire and other common materials of substrate.

Figure 11:
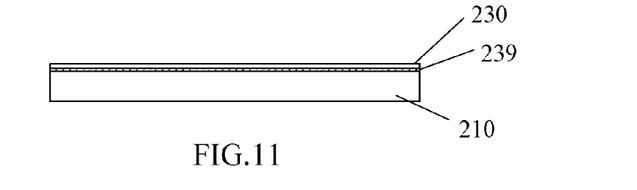

As shown in FIG. 11, with reference to the step S21, an etching mask layer 239 and a top semiconductor layer 230 are formed sequentially on surfaces of the first substrate 210.

In this embodiment the material of the top semiconductor layer 230 is monocrystalline silicon and the material of the etching mask layer 239 is silicon oxide. In other embodiments, the materials of the top semiconductor layer 230 can also be germanium, silicon germanium, and other common semiconductor materials, and the method of growing is not limited by means of the chemical vapor deposition. The material of the etching mask layer 239 can also use whichever material can be used as etching mask, such as silicon nitride, or monocrystalline silicon with different concentrations and so on.

Figure 12:
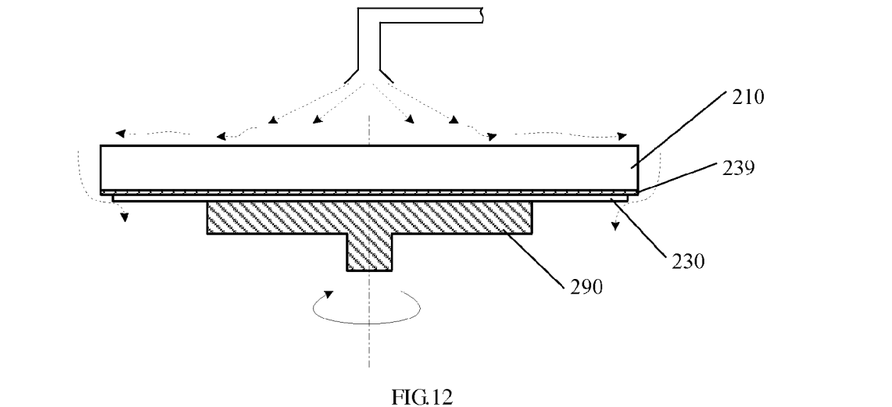

As shown in FIG. 12, with reference to the step S22, the top semiconductor layer 230 of the first substrate 210 is placed downwardly on the spin etching carrier platform 290, the etching solution of etching the top semiconductor layer 230 is passed to the back side of the first substrate 210 along with rotating the substrate, and the etching solution is passed through the edge of the first substrate to the edge of the top semiconductor layer 230 in order to etch the edge part of the top semiconductor layer 230.

In the case that the material of the top semiconductor layer 230 is silicon, it can use tetramethylammonium hydroxide (TMAH) as etching solution. It needs to optimize the process parameters of the etching time and the concentration of the etching solution in this step. It makes the etching rate controllable and the etching time controlled within the reasonable range. If passing flow of the etching solution is too large or the concentration of the etching solution is too high, then the etching rate becomes fast and hard to control. On the contrary, if passing flow of the etching solution is too small or the concentration of the etching solution is too low, then the etching time becomes long that is not to benefit for the process efficiency. In experiment, it needs to control the concentration of the etching solution among 5% to 50%, and the flow range of the etching solution among 0.5 L to 2.5 L per minute. Which speed and time of the etching both can be controlled together are greatly suitable process parameters. Further, an optimal passing flow of the etching solution is the range from 1.0 L to 1.5 L per minute.

In this step, another key parameter is the rotary rate of the spin etching. Choosing the suitable rotary rate is beneficial to control an etched-off edge width of the etched top semiconductor layer 230. Rotary rate being too fast will lead most of the solution to directly swing beyond the substrate, rather than pass through the edge to the front of the first substrate 210, and due to the centrifugal force, only one very narrow part of the edge is immersed in the etching solution which is passing onto the front. On the contrary, if the rotary rate is too slow, thus it is easy to get adverse effects. As shown in experiments, an optimal rotary rate range is from 50 cycles to 1000 cycles per minute, especially in the better rotary rate range from 100 cycles to 500 cycles per minute.

In this step, if the etching solution is directly passed to the top semiconductor layer 230 of the first substrate 210 with the front exposed surface, it will totally remove the top semiconductor layer 230 and fail to edge etching.

In the case that the materials of the top semiconductor layer 230 and the first substrate 210 are the same, the back of the first substrate 210 is better to grow cover layers (not shown), and the material of which is different from the materials of the top semiconductor layer 230 and the first substrate 210. Because if there does not exist the cover layer, the etching solution will be consumed by the first substrate 210, and fail to etch the front of the top semiconductor layer 230. Thus, in the case that the materials of the top semiconductor layer 230 and the first substrate 210 are the same, the existence of the cover layer is particularly important.

Figure 13:
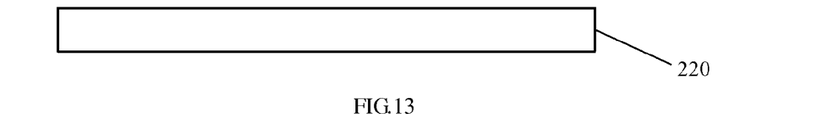

As shown in FIG. 13, with reference to the step S23, a second substrate 220 is provided and the second substrate 220 is used to form s handle substrate with a buried insulating layer.

In this embodiment, the material of the second substrate 220 is monocrystalline silicon. The material selectable for the second substrate 220 is broader. Due to the second substrate 220 used as handle layer, in addition to the common substrates such as common monocrystalline silicon substrate and sapphire substrate, silicon carbide, diamond, glass, even metal substrate and so on are also the available choices.

Figure 14:
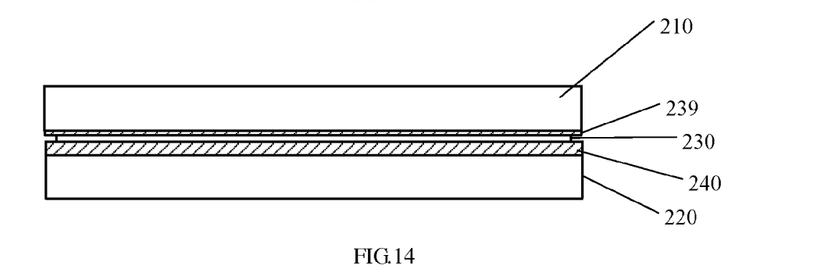

As shown in FIG. 14, with reference to the step S24, the first substrate 210 is bonded to the second substrate 220 with a buried insulating layer 240, wherein the top semiconductor layer 230 of the first substrate 210 with edge etched faces the second substrate 220.

The buried insulating layer 240 can be formed on the surface of the first substrate 210 or the top semiconductor layer 230 in advance. Also, the buried insulating layers can be formed on the both surfaces of the two layers.

After formed, the buried insulating layer 230 is bonded to get the structure as shown in FIG. 14. The process of bonding is a common process in the art, and specific embodiments are not amplified.

Figure 15:
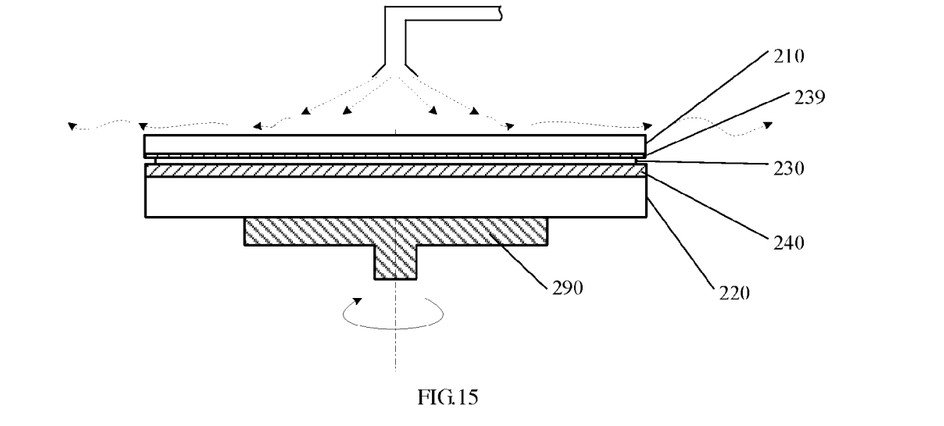
FIG. 15 is a schematic diagram illustrating implementing steps of the third embodiment of the present invention.

As shown in FIG. 15, with reference to the step S25, the first substrate 210 and the etching mask layer 239 are removed. In this embodiment the first substrate 210 and the etching mask layer 239 are removed by the process of spin etching.

Since the thickness of the first substrate 210 is generally larger than hundreds microns in order to improve the process efficiency, it may use the process of grinding to thin the first substrate 210 at first before etching. The process of grinding can be any common process of grinding and thinning in the prior art including the process of chemical mechanical polishing.

The etching solution used to etch the first substrate 210 selects tetramethylammonium hydroxide (TMAH), and the etching selectivity of the solution with monocrystalline silicon and silicon oxide are better. Since this step stops on the surface of the etching mask layer 239, and the structure of the etching mask layer 239 can not be absolutely compact, and there consequentially exist penetrable defects and pinholes with certain density, and the etching solution is easy to pass through the pinholes and the penetrable defects into the top semiconductor layer 230 below the etching mask layer 239. Because the materials of the top semiconductor layer 230 and the first substrate 210 are as same as monocrystalline silicon, the top semiconductor layer 230 also has the risk of being etched.

In this embodiment, to avoid occurrence of the above manner, the process of spin etching is used instead of the traditional process of immersed type etching. In the spin etching process of this step, the first substrate 210 is placed upwardly on the spin etching carrier platform 290 and the etching solution is jetted to the surface of the centre of the first substrate 210 along with rotating the first substrate 210, and the etching solution will flow from the centre to the around of the surface of the first substrate 210 under the rotary centrifugal force. Because the etching solution has a relative motion with the substrate, and the relative motion is along the direction of the surface of the first substrate 210, thus it avoids the immersed phenomenon to happen that the etching solution flows along the direction perpendicular to the surface of the first substrate 210. The placement and rotating of the substrate, and flow type of the etching solution can be referred to the FIG. 15.

The rotary speed of spin etching and the time of etching are important in this step, especially. The excessively slow rotary speed and the excessively high temperature go against restraining the immersing phenomenon of the etching solution, and excessively fast rotary speed and the excessively low temperature will result in that the etching solution is flowing through the substrate quickly without chemical reaction, and result in that the speed of the etching solution gets slow, thus it needs to optimize the rotary speed to gain the best effect. Rotary speed of the substrate is from 3000 cycles to 10000 cycles per minute in the process of spin etching of this step, and the optimum is 4000 cycles per minute. The temperature range of the etching solution is from 80° C. to 100° C., and the optimum is 90° C. The above temperatures are beneficial to work out activities of the etching solution.

In this embodiment, an etching solution of continuously removing the etching mask layer 239 is hydrofluoric acid after removing the first substrate 210. The same to the depiction above, the process of spin etching can avoid the etching solution from immersing into the top semiconductor layer 230 to etch the buried insulating layer 240. A rotary speed is used from 3000 cycles to 10000 cycles per minute and the optimum is 4000 cycles per minute. Besides, the advantage of the process of spin etching in this step is also able to improve the smoothness of the surface of the top semiconductor layer 230. Continuously removing the etching mask layer 239 uses the placement and rotating of the substrate and the flow of the etching solution which are the same as illustrated in FIG. 15.

It can achieve the substrate with a buried insulating layer after performing the processes including the above steps, wherein the structure of the substrate is similar to as previously detailed with FIG. 8, and here is not shown again.

Because the top semiconductor layer 230 has done process of edge etching before bonding, the edge of the top semiconductor layer 230 used to bond of the thinned substrate has been removed ahead, and it need not process again. Compared with the prior art, in this embodiment an edge etching process is performed firstly the top semiconductor layer 230 and then bonding is done for that. Thus it avoids damaging the substrate during the process of processing the edge of the bonded substrate. The semiconductor layer 230 is etched by spin etching process. The etching rate is easy to control and the uniformity and concentricity are better than common etching processes, especially suitable for etching the edges of wafers.

The following is a third embodiment of the present invention provided with the figures.

Figure 16:
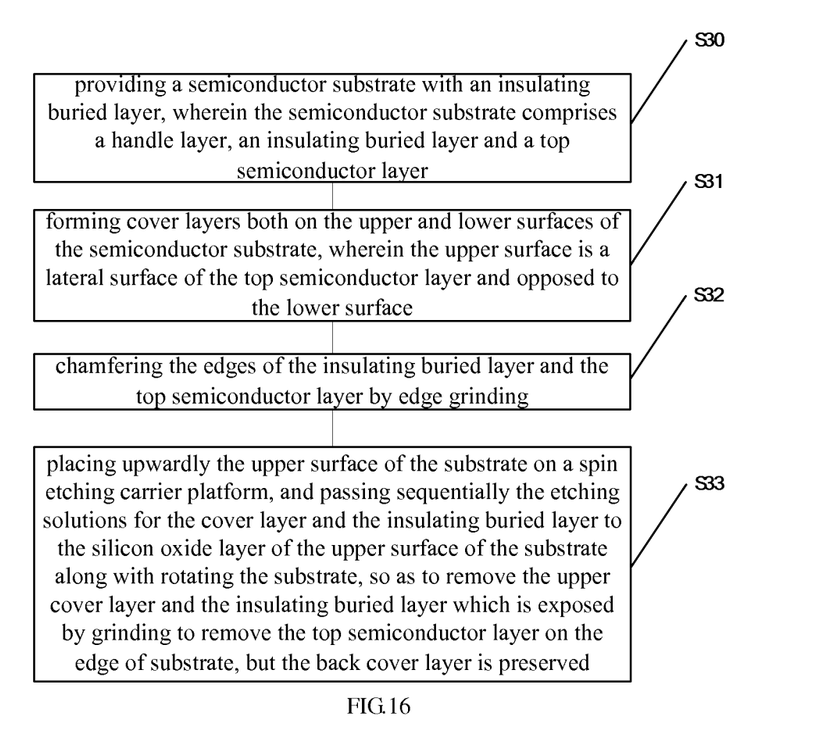
FIGS. 16-21 are schematic diagrams illustrating process of the third embodiment of the present invention.

FIG. 16 is a schematic diagram illustrating implementing steps of this embodiment, which comprises: step S30, providing a semiconductor substrate with a buried insulating layer, wherein the semiconductor substrate comprises a handle layer, a buried insulating layer and a top semiconductor layer; step S31, forming cover layers both on the upper and lower surfaces of the semiconductor substrate, wherein the upper surface is a lateral surface of the top semiconductor layer and opposed to the lower surface; step S32, chamfering the edges of the buried insulating layer and the top semiconductor layer by edge grinding; step S33, placing upwardly the upper surface of the substrate on a spin etching carrier platform, and passing sequentially the etching solutions for the cover layer and the buried insulating layer to the silicon oxide layer of the upper surface of the substrate along with rotating the substrate, so as to remove the upper cover layer and the buried insulating layer which is exposed by grinding to remove the top semiconductor layer on the edge of substrate, but the back cover layer is preserved.

In this embodiment, the material of the top semiconductor layer is silicon, and the materials of the buried insulating layer and the cover layer are silicon oxide, the etching solutions used for the relative buried insulating layer and cover layer both are hydrofluoric acid. The material of the top semiconductor layer can be germanium, silicon germanium and anyone of the common semiconductor materials and the materials of the buried insulating layer and the cover layer can be silicon nitride and other insulating materials. Furthermore, according to which materials are used in the case, suitable solutions are selected as the etching solutions for etching the buried insulating layer and cover layer.

FIGS. 17-21 are schematic diagrams illustrating process of this embodiment.

Figure 17:
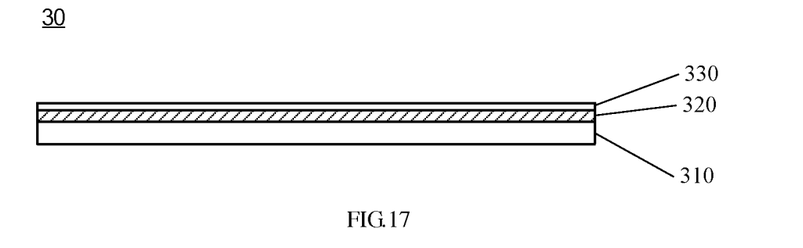

As shown in FIG. 17, with reference to the step S30, a semiconductor substrate 30 with a buried insulating layer is provided, wherein the substrate with a buried insulating layer comprises a handle layer 310, a buried insulating layer 320 and a top semiconductor layer 330.

The handle substrate 310 used to handle the buried insulating layer 320 and the top semiconductor layer 330 has the thickness of generally hundreds microns. The buried insulating layer 320 and the top semiconductor layer 330 commonly have a thickness range of only several microns to tens nanometers and thus need to be placed on the rather thick handle substrate 310 so as to further use in subsequent process. The material of the handle substrate 310 can be monocrystalline silicon, sapphire and other common materials of substrate, and even can also be aluminium or copper and other metal materials.

Figure 18:
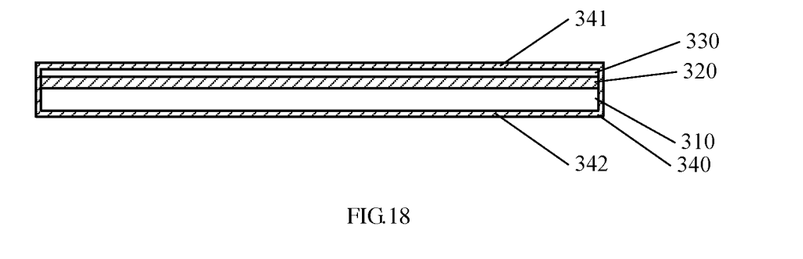

As shown in FIG. 18, with reference to the step S31, cover layers 340 both are formed on the front and back of the semiconductor substrate 30, which includes the front cover layer 341 and the back cover layer 342, wherein the front is the surface of one side of the top semiconductor layer 330, and the back is the other surface opposed to the front.

Forming the cover layer can use common processes such as chemical vapor deposition. If the materials of the handle substrate 310 and the top semiconductor layer 330 are both monocrystalline silicon, then the cover layer 340 can be formed with silicon dioxide by thermal oxidation. The advantages of the thermal oxidation are that the texture of the cover layer 340 gets greatly compact than forming by other process and the thickness of the front is uniform equal to the back.

Figure 19:
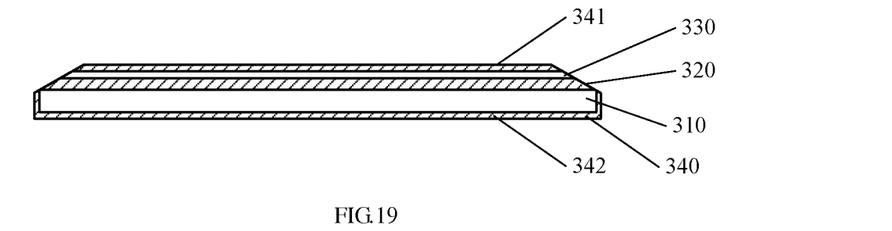

As shown in FIG. 19, with reference to the step S32, the edges of the buried insulating layer 320 and the top semiconductor layer 330 are chamfered by edge grinding.

The edge grinding process of chamfering the wafer is a common process, which will not be discussed here. By calculating the angles and speed of grinding in the chamfering process of this step, the edges of the buried insulating layer 320 and the top semiconductor layer 330 both can be grinded to inclined planes to expose the edge part of the buried insulating layer 320. This will make sure the smooth implementation of the subsequent process of etching.

Figure 20:
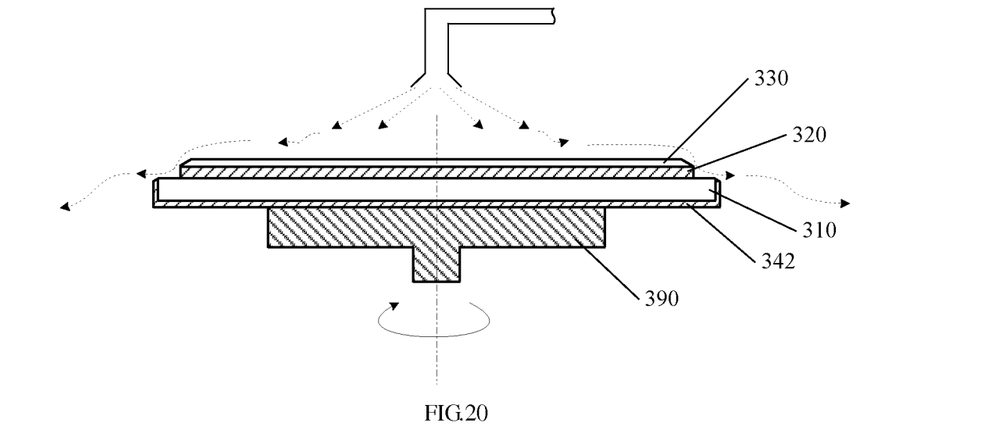

As shown in FIG. 20, with reference to the step S33, the upper surface of the substrate 30 is placed upwardly on the spin etching carrier platform 390, and the etching solution is passed sequentially for the cover layer 341 and the buried insulating layer 320 to the upper surface of the substrate 30 along with rotating the substrate, so as to remove the front cover layer 341 and the buried insulating layer which is exposed by grinding to remove the front cover layer 341 on the edge of substrate 30, but the back cover layer 342 is preserved.

In this embodiment, the materials of the insulating layer 320 and the cover layers 340 are both silicon oxide. Thus a hydrofluoric acid is able to use as the solution for the cover layers 340 and also as the solution for the buried insulating layer 320.

In other embodiment, in a case that if the materials of the buried insulating layer 320 and the cover layers 340 are different and both can not be etched by a kind of etching solution, it should separately choose two kinds of different etching solutions. And in this step, it allows to pass anyone of etching solutions at first to perform the process of spin etching.

Due to the block effect of the top semiconductor layer 330, the etching solution for the buried insulating layer in this step only etches the exposed buried insulating layer 320.

It needs to optimize the process parameters of the etching time and the concentration of the etching solution in this step, and it makes the etching rate to achieve to be able to control, and control the etching time under the reasonable range. If passing flow of the etching solution is too large or the concentration of the etching solution is too high, then the etching rate becomes fast and hard to control; conversely, if passing flow of the etching solution is too small or the concentration of the etching solution is too low, then the etching time becomes long and goes against improving the process efficiency. Thus it needs to control the concentration and speed of the etching solution under the suitable range to gain the balance of the controllability and speed of the etching solution. An optimal mass concentration range of the hydrofluoric acid is from 5% to 49%, and an optimal flow range of the hydrofluoric acid is from 0.5 L to 2.5 L per minute, especially in an optimized flow range of from 1.5 L to 2.5 L per minute for the hydrofluoric acid.

In this step, another key parameter is the rotary rate of the spin etching. If the back cover layer 342 has to be preserved completely in this step, it needs to control the etching solution for the cover layer not flowing to the other surface of the substrate 30 as far as possible. Thus when the etching solution etches the cover layers 340, it is better to control the rotary rate of the platform 390 within a wide range. As shown in experiments, an optimal rotary rate is more than 500 cycles per minute in such a step, especially in an optimized rotary rate of more than 1500 cycles per minute.

Figure 21:
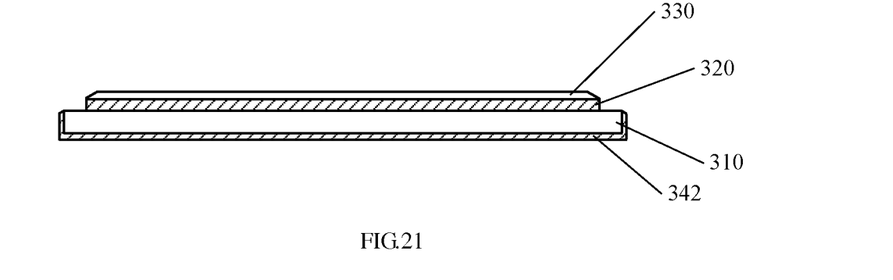

FIG. 21 is a schematic diagram illustrating the substrate acquired after the above steps are implemented. The edges of the top semiconductor layer 330 and the buried insulating layer 320 have been removed to chamfer by edge grinding. Thus, this avoids the appearance of the edge collapses in subsequent processes, and keeps the cover layer 342 of the back of the substrate 30 remaining by applying the centrifugal force on the etching solution during the spin etching process of etching the front cover layer 341, and avoids damaging to the original structure of the back of the substrate 30 and affecting the balance wrap degree of the final product.

The following is a fourth embodiment of the present invention provided with the figures.

Figure 22:
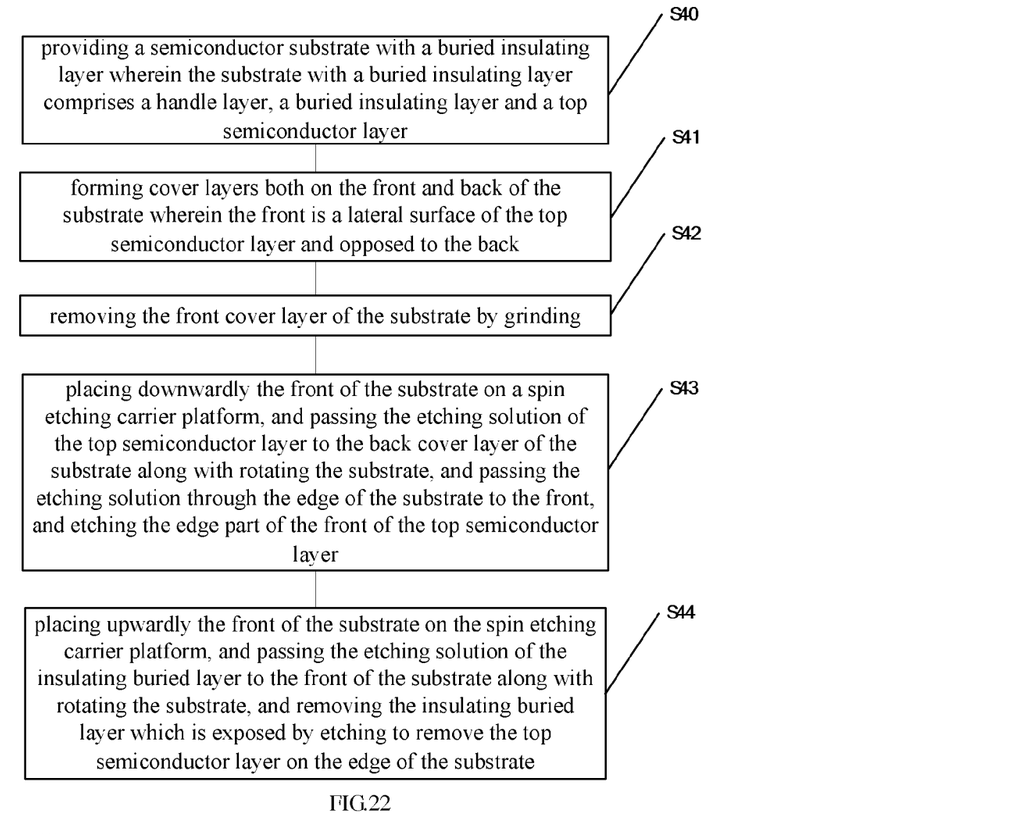
FIG. 22 is a schematic diagram illustrating implementing steps of the fourth embodiment of the present invention.

FIG. 22 is a schematic diagram illustrating implementing steps of this embodiment, which comprises the following steps: step S40, providing a semiconductor substrate with a buried insulating layer wherein the substrate with a buried insulating layer comprises a handle layer, a buried insulating layer and a top semiconductor layer; step S41, forming cover layers both on the front and back of the substrate wherein the front is a lateral surface of the top semiconductor layer and opposed to the back; step S42, removing the front cover layer of the substrate by grinding; step S43, placing downwardly the front of the substrate on a spin etching carrier platform, and passing the etching solution of the top semiconductor layer to the back cover layer of the substrate along with rotating the substrate, and passing the etching solution through the edge of the substrate to the front, and etching the edge part of the front of the top semiconductor layer; step S44, placing upwardly the front of the substrate on the spin etching carrier platform, and passing the etching solution of the buried insulating layer to the front of the substrate along with rotating the substrate, and removing the buried insulating layer which is exposed by etching to remove the top semiconductor layer on the edge of the substrate.

In the other embodiment, the material of the top semiconductor layer is silicon, and the corresponding etching solution used for etching the top semiconductor layer is tetramethylammonium hydroxide. The material of the buried insulating layer is silicon oxide, and the corresponding etching solution for the buried insulating layer is hydrofluoric acid. The material of the top semiconductor can be germanium, silicon germanium and anyone of other common semiconductor materials. The material of the buried insulating layer can be silicon nitride and other insulating materials. According to which the materials is used, a suitable solution is selected as the etching solution for etching the top semiconductor layer.

FIGS. 23-28 are schematic diagrams illustrating process of this embodiment.

Figure 23:
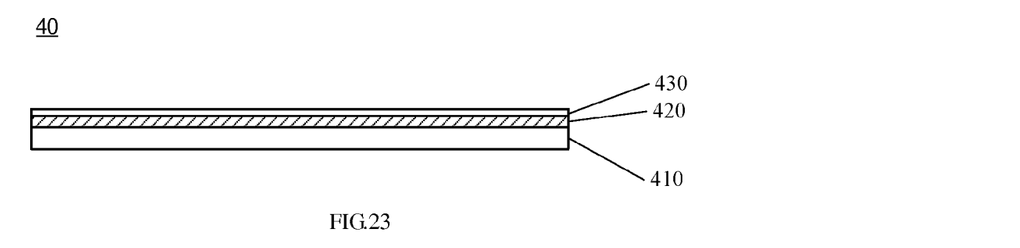
FIGS. 23-28 are schematic diagrams illustrating process of the fourth embodiment of the present invention.

As shown in FIG. 23, with reference to the step S40, a semiconductor substrate 40 with a buried insulating layer is provided wherein the substrate 40 with a buried insulating layer comprises a handle layer 410, a buried insulating layer 420 and a top semiconductor layer 430.

The handle layer 410 used to handle the buried insulating layer 420 and the top semiconductor layer 430 commonly has a thickness of hundreds microns. The buried insulating layer 420 and the top semiconductor layer 430 commonly have a thickness range of only several microns to tens nanometers and thus need to be placed on the rather thick handle substrate 410 so as to further use in subsequent process. The materials of the handle substrate 410 can be monocrystalline silicon, sapphire and other common materials of substrate, even can also be aluminium or copper, and other metal materials.

Figure 24:
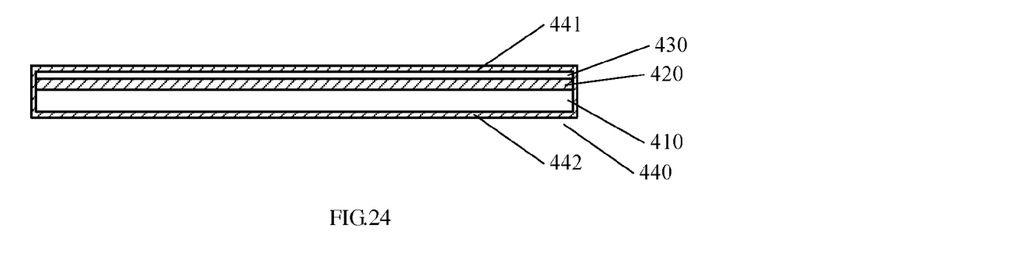

As shown in FIG. 24, with reference to the step S41, cover layers 440 both are formed on the front and backs of the substrate 40 which includes the front cover layer 441 and the back cover layer 442, wherein the front is a lateral surface of the top semiconductor layer 430 and opposed to the back.

Forming the cover layer can use common processes such as chemical vapor deposition. If the materials of the handle layer 410 and the top semiconductor layer 430 are both monocrystalline silicon, then the cover layer 440 can be made of silicon dioxide by thermal oxidation. The advantages of the means of thermal oxidation are that the texture of the cover layer 440 is greatly compact than forming by other processes, and the thickness of the front is uniform equal to the back.

Figure 25:
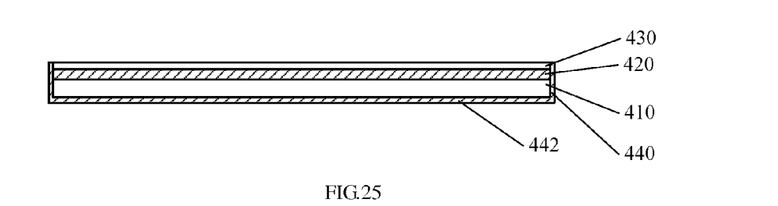

As shown in FIG. 25, with reference to the step S42, the front cover layer 441 of the substrate 410 is removed by grinding.

A purpose of this step using grinding than other methods but is to make sure removal of the front cover layer 441 without affecting the back cover layer 442 and integrality of the back cover layer 442 after this step.

Figure 26:
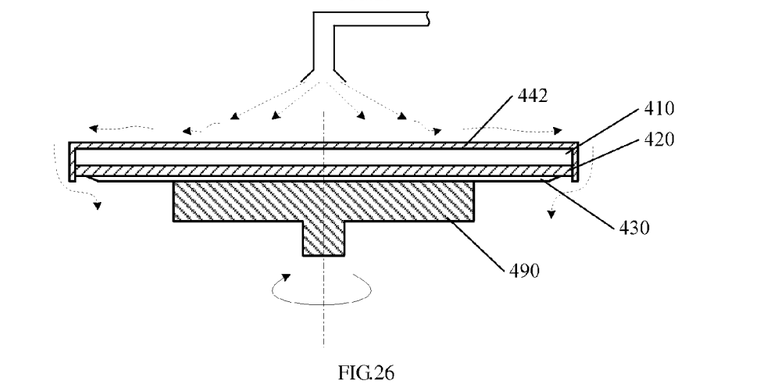

As shown in FIG. 26, with reference to the step S43, the front of the substrate 40 is placed downwardly on the spin etching carrier platform 490, and the etching solution of the top semiconductor layer 430 is passed to the back cover layer 442 of the substrate 40 along with rotating the substrate 40, and the etching solution is passed through the edge of the substrate 40 to the front, and the edge part of the front of the top semiconductor layer 430 is etched.

In a case that the material of the top semiconductor layer 430 is silicon, tetramethylammonium hydroxide (TMAH) can be used as an etching solution. This step needs to optimize the process parameters of the etching time and the concentration of the etching solution. This makes the etching rate controllable and the etching time controlled within the reasonable range. If passing flow of the etching solution is too large or the concentration of the etching solution is too high, then the etching rate becomes fast and hard to control. On the contrary, if passing flow of the etching solution is too small or the concentration of the etching solution is too low, then the etching time becomes long that is not to benefit for the process efficiency. The practice shows that it needs to control the concentration of the etching solution among 5% to 50%, and the flow range of the etching solution among 0.5 L to 2.5 L per minute. This will leads to balance the speed and time of the etching as greatly suitable process parameters. Further, an optimal flow range of the etching solution is from 1.0 L to 1.5 L per minute.

In this step, another key parameter is the rotary rate of the spin etching. Choosing the suitable rotary rate is beneficial to control an etched-off edge width of the etched top semiconductor layer 430. Rotary rate being too fast will lead most of the solution to directly swing beyond the substrate, rather than pass through the edge to the front of the substrate 40, and the very narrow part of the edge can only be immersed in the etching solution which is passing onto the front due to the centrifugal force; conversely, if rotary rate is too slow, thus it is easy to get adverse effects. As shown in experiments, an optimal rotary rate range are 50 cycles to 1000 cycles per minute, especially the better rotary rate range are 100 cycles to 500 cycles per minute.

In this step, if the etching solution directly passes the top semiconductor layer 430 of the substrate 40 with the front exposed surface, it will totally remove the top semiconductor layer 430 and fail to edge etching.

In a case that the top semiconductor layer 430 and the handle layer 410 are made of different materials and the etching solution can not etch the handle layer 410, this step can also be implemented before the step S41 is done.

In a case that the top semiconductor layer 430 and the handle layer 410 are made of the same material, this step has to be implemented after the step S42 is done and skillfully uses the back cover layer 442 as an etching mask layer. If the back cover layer 442 does not exist, the etching solution will directly pass the surface of the handle layer 410.

In most of cases, the materials of the top semiconductor layer 430 and the handle layer 410 both are made of monocrystalline silicon. This is because the monocrystalline silicon is the most popular material for the semiconductor field. In this case, the etching solution will be consumed by the handle layer 410 and can not etch the front surface of the top semiconductor layer 430. Thus in the case that the top semiconductor layer 430 and the handle layer 410 both are made of the same the material, the existing of the back cover layer 442 is especially important.

Figure 27:
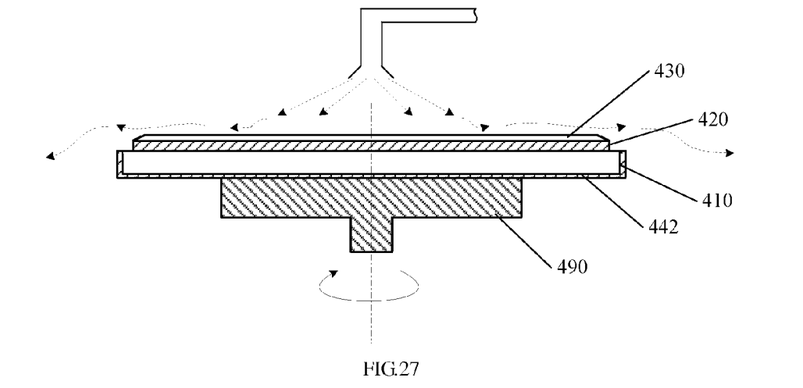

As shown in FIG. 27, the step S44 is introduced with placing upwardly the front of the substrate 40 on the spin etching carrier platform 490, passing the etching solution of the buried insulating layer to the front of the substrate 40 along with rotating the substrate 40, and removing the buried insulating layer 420 which is exposed by etching to remove the top semiconductor layer 430 on the edge of the substrate 40.

In the case that the material of the buried insulating layer 420 is silicon, a hydrofluoric acid can be used as the etching solution.

Due to the block effect of the top semiconductor layer 430, the etching solution used for this step only etches the exposed buried insulating layer 420.

Similarly to the above steps, the concentration, flow of the etching solution and the rotary speed of the platform 490 all may affect the implementation efficiency of the etching process. Thus, it needs to control the concentration and flow of the etching solution within the proper range, so as to balance the controllability and speed of the etching solution. An optimal mass concentration range of the hydrofluoric acid is from 5% to 49%, and an optimal flow range of the hydrofluoric acid is from 0.5 L to 2.5 L per minute, especially in an optimized flow range of 1.5 L to 2.5 L per minute for the hydrofluoric acid.

However, on the contrary with the step S43, the step needs to keep the back cover layer 442 completely remaining and thus is expected not to pass the etching solution to the other surface of the substrate 40. Accordingly, it is better to control the rotary speed of the platform 490 within a wide range in this step. As shown in experiments, an optimal rotary rate is more than 500 cycles per minute in such a step, especially in an optimized rotary rate of more than 1500 cycles per minute.

Figure 28:
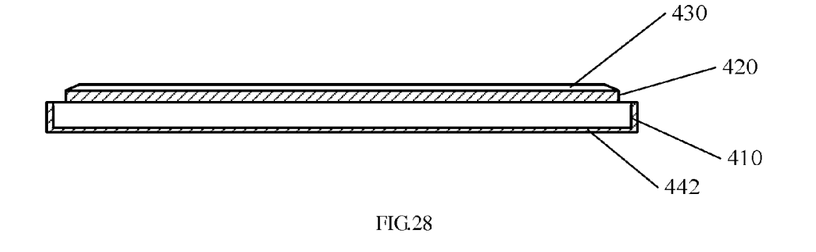

FIG. 28 is a schematic diagram illustrating the substrate acquired after the above steps are implemented. The edges of the top semiconductor layer 430 and the buried insulating layer 420 have been removed by means of spin etching. Thus, this avoids the appearance of the edge collapses in subsequent processes and keeps the back cover layer 442 of the substrate 40 integrity, and avoids changes of the wrap degree resulted from the unbalance stresses of the two sides of the substrate 40. Furthermore, the advantages of the above method are in that the method of removing the edge of the top semiconductor layer 420 applies a centrifugal-force effect on the etching solution by spin etching process and thereby achieves a better concentricity than the common processes of grinding.

The above mentioned are the preferred embodiments of the present invention, should be said, according to those skilled in the art, on the premise without departure from the present invention principle, and some improvements and modifications can be made, which are also within the scope of the present invention.

What is claimed is:

1. A method for forming an edge-chamfered substrate with a buried insulating layer, comprising the following steps of:
   providing a first substrate for forming a top semiconductor layer of the substrate with the buried insulating layer;
   forming an etching mask layer on the surface of the first substrate;
   chamfering the first substrate and the etching mask layer on the surface of the first substrate by edge grinding;
   by spin etching, etching the first substrate which is exposed by the edge grinding on the etching mask layer;
   providing a second substrate for forming a handle layer of the substrate with a buried insulating layer; and
   bonding the first substrate to the second substrate via a buried insulating layer, wherein the edge-grinded surface of the first substrate faces the second substrate.

2. The method for forming an edge-chamfered substrate with a buried insulating layer according to said claim 1, wherein the etching mask layer is formed on the whole surfaces of the first substrate, a glazed surface of which is selectively performed by the step of edge grinding.

3. The method for forming an edge-chamfered substrate with a buried insulating layer according to said claim 2, wherein in the step of the spin etching, the chamfered surface of the first substrate is upwardly deposited on an spin etching carrier platform, and an etching solution is passed to the upward surface along with rotating the substrate, and a rotary rate of spin etching is more than 500 cycles per minute.

4. The method for forming an edge-chamfered substrate with a buried insulating layer according to said claim 3, wherein the first substrate is a monocrystalline silicon substrate, the etching mask layer is silicon oxide, and the etching solution used in the spin etching is tetramethylammonium hydroxide.

5. The method for forming an edge-chamfered substrate with a buried insulating layer according to said claim 4, wherein the mass concentration range of the solution used in hydrofluoric acid is from 5% to 49%.

6. The method for forming an edge-chamfered substrate with a buried insulating layer according to said claim 4, wherein a flow range of the solution used in hydrofluoric acid is from 500 ml to 2500 ml per minute.

7. A method for forming an edge-chamfered substrate with a buried insulating layer, comprising the following steps of:
   providing a first substrate;
   forming sequentially an etching mask layer and a top semiconductor layer on a surface of the first substrate;
   placing downwardly the top semiconductor layer of the first substrate on a spin etching carrier platform, and passing an etching solution of etching the top semiconductor layer to the back side of the first substrate along with rotating the substrate, and passing the etching solution through the edge of the first substrate to the edge of the top semiconductor layer so as to etch the edge part of the top semiconductor layer;

providing a second substrate for forming a handle layer of the substrate with a buried insulating layer;

bonding the first substrate to the second substrate via a buried insulating layer, wherein the edge-etched top semiconductor layer of the first substrate faces the second substrate; and removing the first substrate and the etching mask layer.

8. The method for forming an edge-chamfered substrate with a buried insulating layer according to said claim 7, wherein a rotary rate range of spin etching is from 50 cycles to 1000 cycles per minute in the step of etching the top semiconductor layer.

9. The method for forming an edge-chamfered substrate with a buried insulating layer according to said claim 7 or 8, wherein the material of the top semiconductor layer is monocrystalline silicon, and the etching solution used for etching the top semiconductor layer is tetramethylammonium hydroxide.

10. The method for forming an edge-chamfered substrate with a buried insulating layer according to said claim 9, wherein a mass concentration range of the tetramethylammonium hydroxide is from 5% to 50%, and a flow range of tetramethylammonium hydroxide is from 0.5 L to 2.0 L per minute in the step of etching the top semiconductor layer.

11. A method for forming an edge-chamfered substrate with a buried insulating layer, comprising the following steps of:

providing a semiconductor substrate with a buried insulating layer, wherein the substrate of the silicon on the insulator comprises a handle layer, a buried insulating layer and a top semiconductor layer;

forming cover layers both on the upper and lower surfaces of the substrate, wherein the upper surface is a lateral surface of the top semiconductor layer and opposed to the lower surface;

chamfering edges of the buried insulating layer and the top semiconductor layer by edge grinding; and placing upwardly the upper surface of the substrate on a spin etching carrier platform, and passing sequentially an etching solution for the cover layer and the buried insulating layer to the cover layer of the upper surface of the substrate along with rotating the substrate and thereby removing the cover layer of the upper surface and the buried insulating layer on the edge of substrate which is exposed by grinding, but preserving the back cover layer.

12. The method for forming an edge-chamfered substrate with a buried insulating layer according to said claim 11, wherein the buried insulating layer and the cover layer consist of the same material, the solutions of the insulating buried layer and the buried insulating layer are the same solution.

13. The method for forming an edge-chamfered substrate with a buried insulating layer according to said claim 11 or 12, wherein a rotary rate of the spin etching is more than 500 cycles per minute in the steps of etching the cover layer and the buried insulating layer.

14. The method for forming an edge-chamfered substrate with a buried insulating layer according to said claim 12, wherein the materials of the buried insulating layer and the cover layer are silicon oxide, and the etching solution is hydrofluoric acid.

15. The method for forming an edge-chamfered substrate with a buried insulating layer according to said claim 14, wherein a mass concentration range of the solution of the hydrofluoric acid is from 5% to 49%.

16. The method for forming an edge-chamfered substrate with a buried insulating layer according to said claim 14, wherein a flow range of the hydrofluoric acid is from 500 ml to 2500 ml per minute.

17. A method for forming an edge-chamfered substrate with a buried insulating layer, comprising the following steps of:

providing a semiconductor substrate with a buried insulating layer, wherein the substrate comprises a handle layer, a buried insulating layer and a top semiconductor layer;

forming cover layers both on the front and back of the semiconductor substrate, wherein the front is a lateral surface of the top semiconductor layer and opposed to the back;

removing the front cover layer of the substrate by grinding;

placing downwardly the front of the substrate on a spin etching carrier platform, and passing an etching solution of the top semiconductor layer to the back cover layer of the substrate along with rotating the substrate, and passing the etching solution through the edge of the substrate to the front of the top semiconductor layer, and etching the edge part of the front of the top semiconductor layer; and placing upwardly the front of the substrate on the spin etching carrier platform, and passing an etching solution of the buried insulating layer to the front of the substrate along with rotating the substrate, and removing the buried insulating layer on the edge of the substrate which is exposed by etching of the top semiconductor layer.

18. The method for forming an edge-chamfered substrate with a buried insulating layer according to said claim 17, wherein a rotary rate range of spin etching is from 50 cycles to 1000 cycles per minute in the step of etching the top semiconductor layer.

19. The method for forming an edge-chamfered substrate with a buried insulating layer according to said claim 17 or 18, wherein the material of the top semiconductor layer is silicon, and the etching solution used for etching the top semiconductor layer is tetramethylammonium hydroxide.

20. The method for forming an edge-chamfered substrate with a buried insulating layer according to said claim 19, wherein a mass concentration range of tetramethylammonium hydroxide is from 5% to 50%, and a flow range of tetramethylammonium hydroxide is from 0.5 L to 2.0 L per minute in the step of etching the top semiconductor layer.

21. The method for forming an edge-chamfered substrate with a buried insulating layer according to said claim 17, wherein a rotary rate of spin etching is more than 500 cycles per minute in the step of etching the buried insulating layer.

22. The method for forming an edge-chamfered substrate with a buried insulating layer according to said claim 17 or 21, wherein the material of the buried insulating layer is silicon oxide, and the etching solution used to etch the buried insulating layer is hydrofluoric acid.

23. The method for forming an edge-chamfered substrate with a buried insulating layer according to said claim 22, wherein a mass concentration range of the solution of the hydrofluoric acid is from 5% to 49%, and a flow range of hydrofluoric acid is from 0.5 L to 2.5 L per minute in the step of etching the buried insulating layer.

* * * * *